United States Patent
Lu et al.

(10) Patent No.: US 12,183,867 B2
(45) Date of Patent: Dec. 31, 2024

(54) DRIVING SUBSTRATE, MANUFACTURTION METHOD THEREOF AND DISPLAY DEVICE

(71) Applicant: BOE TECHNOLOGY GROUP CO., LTD., Beijing (CN)

(72) Inventors: Xinhong Lu, Beijing (CN); Zhanfeng Cao, Beijing (CN); Jingshang Zhou, Beijing (CN); Liuqing Li, Beijing (CN); Ting Zeng, Beijing (CN); Yongfei Li, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 17/628,926

(22) PCT Filed: Mar. 10, 2021

(86) PCT No.: PCT/CN2021/079920
§ 371 (c)(1),
(2) Date: Jan. 21, 2022

(87) PCT Pub. No.: WO2021/218418
PCT Pub. Date: Nov. 4, 2021

(65) Prior Publication Data
US 2022/0254972 A1    Aug. 11, 2022

(30) Foreign Application Priority Data

Apr. 30, 2020   (CN) .......................... 202010365235.6

(51) Int. Cl.
H01L 33/00    (2010.01)
H01L 33/62    (2010.01)
H01L 25/075   (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ................. H01L 33/62; H01L 25/0753; H01L 2933/0066; H01L 27/156; Y02E 10/549; G09F 9/301; G09F 9/33
(Continued)

(56) References Cited

U.S. PATENT DOCUMENTS

| | | | |
|---|---|---|---|
| 2019/0103420 A1* | 4/2019 | Liu | H01L 27/1248 |
| 2019/0164854 A1 | 5/2019 | Liu et al. | |
| 2020/0091198 A1* | 3/2020 | Peng | H01L 21/425 |

FOREIGN PATENT DOCUMENTS

| | | |
|---|---|---|
| CN | 104733498 A | 6/2015 |
| CN | 108417604 A | 8/2018 |

(Continued)

*Primary Examiner* — Theresa T Doan
(74) *Attorney, Agent, or Firm* — HOUTTEMAN LAW LLC

(57) ABSTRACT

The present disclosure provides a driving substrate, including: a flexible substrate including a display region and a bendable region; a first conductive layer on the flexible substrate and including a first wire in the display region, and a connection wire at least partially in the bendable region; a flexible insulating layer including a first insulation pattern in the display region, and a second insulation pattern in the bendable region; a second conductive layer at a side of the flexible insulating layer far away from the flexible substrate; and a planarization layer at a side of the second conductive layer far away from the flexible substrate and having a hollow structure in the bendable region, wherein a thickness of a portion of the second insulating pattern covering the connection wire is d2, a thickness of the flexible substrate is d3, and d2≥2 μm and |d2−d3|≤3 μm.

10 Claims, 11 Drawing Sheets

(58) Field of Classification Search
USPC .......................................................... 257/91
See application file for complete search history.

(56) References Cited

FOREIGN PATENT DOCUMENTS

| | | |
|---|---|---|
| CN | 108598135 A | 9/2018 |
| CN | 109560088 A | 4/2019 |
| CN | 209182794 U | 7/2019 |
| CN | 110379823 A | 10/2019 |
| CN | 110391252 A | 10/2019 |
| CN | 110491882 A | 11/2019 |
| CN | 111524927 A | 8/2020 |

* cited by examiner

DRIVING SUBSTRATE, MANUFACTURTION METHOD THEREOF AND DISPLAY DEVICE

CROSS REFERENCE TO RELATED APPLICATION

This application is a National Phase Application filed under 35 U.S.C. 371 as a national stage of PCT/CN2021/079920, filed on Mar. 10, 2021, the contents of which are incorporated herein by reference in their entirety.

TECHNICAL FIELD

The disclosure relates to the field of display technologies, and in particular, to a driving substrate, a manufacturing method thereof, and a display device.

BACKGROUND

The Micro/Mini light emitting diode (Micro/Mini-LED) display technology, as a new generation display technology, has the advantages of high brightness, good light emitting efficiency, low power consumption, and the like. Generally, a Micro/Mini-LED chip is transferred onto a display substrate by a transfer printing technology, and due to the limitation of the transfer printing technology, a large-size LED display substrate cannot be directly manufactured; therefore, in the prior art, a plurality of small-size LED display substrates are spliced to form a large-size LED display substrate in a splicing manner.

The small-size led display substrate generally includes a display region for displaying and a bonding region for bonding the display substrate to the flexible printed circuit board so that an external signal can be written to the display substrate through the flexible printed circuit board. In the related art, a bendable region is further arranged between the display region and the bonding region on the small-size LED display substrate, so that a portion of the bonding region can be bent to the back of the display substrate, a distance between the display regions in adjacent small-size LED display substrates can be greatly reduced during splicing, and thus splicing gaps can be reduced.

However, in practical application, the film layer in the existing bendable region is complex in structure and thick, and is inconvenient to be bent; in addition, there is a connection wire for electrically connecting a signal line in the display region and a signal line in the bonding region in the bendable region, and the connection wire is easily broken due to an excessive stress when the bendable region is bent.

SUMMARY

The present disclosure is directed to at least one of the technical problems in the prior art, and provides a driving substrate, a method for manufacturing the driving substrate, and a display device.

In a first aspect, an embodiment of the present disclosure provides a driving substrate, including:
- a flexible substrate including a display region and a bendable region;
- a first conductive layer on the flexible substrate, and including a first wire in the display region and a connection wire at least partially in the bendable region;
- a flexible insulating layer, including: a first insulation pattern in the display region and having a first opening in which the first wire is located, and a second insulation pattern in the bendable region and at a side of the connection wire far away from the flexible substrate;
- a second conductive layer at a side of the flexible insulating layer far away from the flexible substrate; and
- a planarization layer at a side of the second conductive layer far away from the flexible substrate and having a hollow structure in the bendable region,
- a thickness of a portion of the second insulating pattern covering the connection wire is $d2$, a thickness of the flexible substrate is $d3$, $d2 \geq 2$ μm and $|d2-d3| \leq 3$ μm.

In some embodiments, the driving substrate is further provided with a protection layer at a side of the planarization layer far away from the flexible substrate and having a hollow structure in the bendable region.

In some embodiments, the protection layer has a hardness greater than 20 GPa.

In some embodiments, the first wire includes a seed pattern and a growth line at a side of the seed pattern far away from the flexible substrate; and
the seed pattern and the connection wire are in a same layer.

In some embodiments, the second conductive layer includes a first connection terminal; and
the planarization layer has a second opening communicating to the first connection terminal in a region where the first connection terminal is located.

In some embodiments, the driving substrate further includes:
a first passivation layer between the flexible insulating layer and the flexible substrate, and having a fourth opening formed at a position corresponding to the first opening.

In some embodiments, the driving substrate further includes:
a second passivation layer between the flexible insulating layer and the second conductive layer, and having a hollow structure in the bendable region.

In some embodiments, the flexible substrate further includes a bonding region at a side of the bendable region far away from the display region; and
the second passivation layer has vents in the bonding region.

In some embodiments, the driving substrate further includes:
a third passivation layer between the second conductive layer and the planarization layer, and having a hollow structure in the bendable region.

In a second aspect, an embodiment of the present disclosure further provides a display device including a light emitting element and the driving substrate as provided in the first aspect, the light emitting element is at a side of the planarization layer far away from the flexible substrate; and
the light emitting element has a first electrode and a second electrode coupled to a conductive structure in the second conductive layer by a via in the planarization layer.

In a third aspect, an embodiment of the present disclosure further provides a method for manufacturing a driving substrate, including:
providing a flexible substrate including a display region and a bendable region;
forming a first conductive layer and a flexible insulating layer on the flexible substrate, the first conductive layer including a first wire in the display region and a connection wire at least partially in the bendable region, and the flexible insulating layer including a first insulation pattern that is in the display region and has a first opening in which the first wire is located, and a second insulation pattern that is in the bendable region and at a side of the connection wire far away from the flexible substrate, a thickness of a portion of the second insulation pattern covering the connection wire being d2, a thickness of the flexible substrate being d3, d2≥2 μm and |d2−d3|≤3 μm;

forming a second conductive layer at a side of the flexible insulating layer far away from the flexible substrate; and forming a planarization layer at a side of the second conductive layer far away from the flexible substrate, the planarization layer having a hollow structure in the bendable region.

In some embodiments, after forming the planarization layer, the method further includes:

forming a protection layer at a side of the planarization layer far away from the flexible substrate, the protection layer having a hollow structure in the bendable region.

In some embodiments, before forming the second conductive layer, the method further includes: forming a second passivation layer at a side of the flexible insulating layer far away from the flexible substrate, the second passivation layer having a hollow structure in the bendable region;

and/or after forming the second conductive layer, the method further includes: forming a third passivation layer at a side of the second conductive layer far away from the flexible substrate, the third passivation layer having a hollow structure in the bendable region.

In some embodiments, forming the first conductive layer and the flexible insulating layer on the flexible substrate includes:

forming a seed pattern and a connection wire on the flexible substrate;

forming an insulating material thin film at a side of the seed pattern and the connection wire far away from the flexible substrate, a thickness of the insulating material thin film being greater than that of the flexible substrate;

forming a first opening in the insulating material thin film through a patterning process to expose the seed pattern, a portion of the insulating material thin film in the display region being the first insulating pattern, and a portion of the insulating material thin film in the bendable region being completely retained;

forming a growth line in the first opening, the seed pattern and the growth line stacked in the first opening constituting the first wire; and thinning the portion of the insulating material thin film in the bendable region, such that a thickness of a portion of the insulating material thin film covering the connection wire is equal to that of the flexible substrate, and the portion of the insulating material thin film in the bendable region is the second insulation pattern.

In some embodiments, a second passivation layer and/or a third passivation layer are formed at a side of the flexible insulating layer far away from the flexible substrate, and thinning the portion of the insulating material thin film in the bendable region includes:

performing an ashing process on the insulating material thin film exposed by the hollow structures of the second passivation layer and/or the third passivation layer, such that the thickness of the portion of the insulating material thin film covering the connection wire subjected to the ashing process is equal to that of the flexible substrate.

In some embodiments, forming the first conductive layer and the flexible insulating layer on the flexible substrate includes:

forming a seed pattern and a connection wire on the flexible substrate;

forming the insulating material thin film at a side of the seed pattern and the connection wire far away from the flexible substrate, a thickness of the insulating material thin film being greater than that of the flexible substrate, and a material of the insulating material thin film including photoresist;

patterning the insulating material thin film through a half-tone mask process, the insulating material thin film being completely removed in a region where the seed pattern is located to form a first opening, the insulating material thin film being partially removed in the bendable region, and a thickness of the portion of the insulating material thin film covering the connection wire being equal to that of the flexible substrate; and forming a growth line in the first opening, the seed pattern and the growth line stacked within the first opening constituting the first wire.

DETAIL DESCRIPTION OF EMBODIMENTS

In order to make those skilled in the art better understand the technical solution of the present disclosure, a driving substrate, a manufacturing method thereof, and a display device provided in the present disclosure are described in detail below with reference to the accompanying drawings.

In the embodiments of the present disclosure, the "flexible substrate" refers to a "base" on which a plurality of layers of other structures are formed in a stacked manner, which has a form similar to a "display substrate". Therefore, it should be understood that the driving substrate (the base and structures thereon) and a printed circuit board (PCB) in the embodiments of the present disclosure are two fundamentally different products.

In the embodiment of the present disclosure, an A structure being on "a side of a B structure far away from the substrate" may mean that the layer of the A structure is formed after forming the layer of the B structure in a stacked relationship, and may also mean that the A structure and the B structure have overlap projections or that the distances from A structure and B structure to the substrate satisfies a specific relationship.

In the embodiment of the present disclosure, an A structure being on "a side of a B structure close to the substrate" may mean that the layer of the A structure is formed before forming the layer of the B structure in a stacked relationship, and may also mean that the A structure and the B structure have overlap projections or that the distances from the A structure and the B structure to the substrate satisfies a specific relationship.

In the embodiments of the present disclosure, two structures "disposed in the same layer" may mean that they are formed in the same film forming process, or that they are formed in the same patterning process, or that they are in the same layer in a stacked relationship, or that their respective distances from the substrate are equal.

In the embodiments of the present disclosure, the "patterning process" may also be referred to as a pattern forming process, which refers to a process of forming a structure having a specific pattern, and may be a photolithography process including one or more steps of photoresist coating, exposure, development, etching, and photoresist stripping after a material is formed into a film; of course, the "patterning process" may also be an imprinting process, an inkjet printing process, or other processes.

Figure 1:
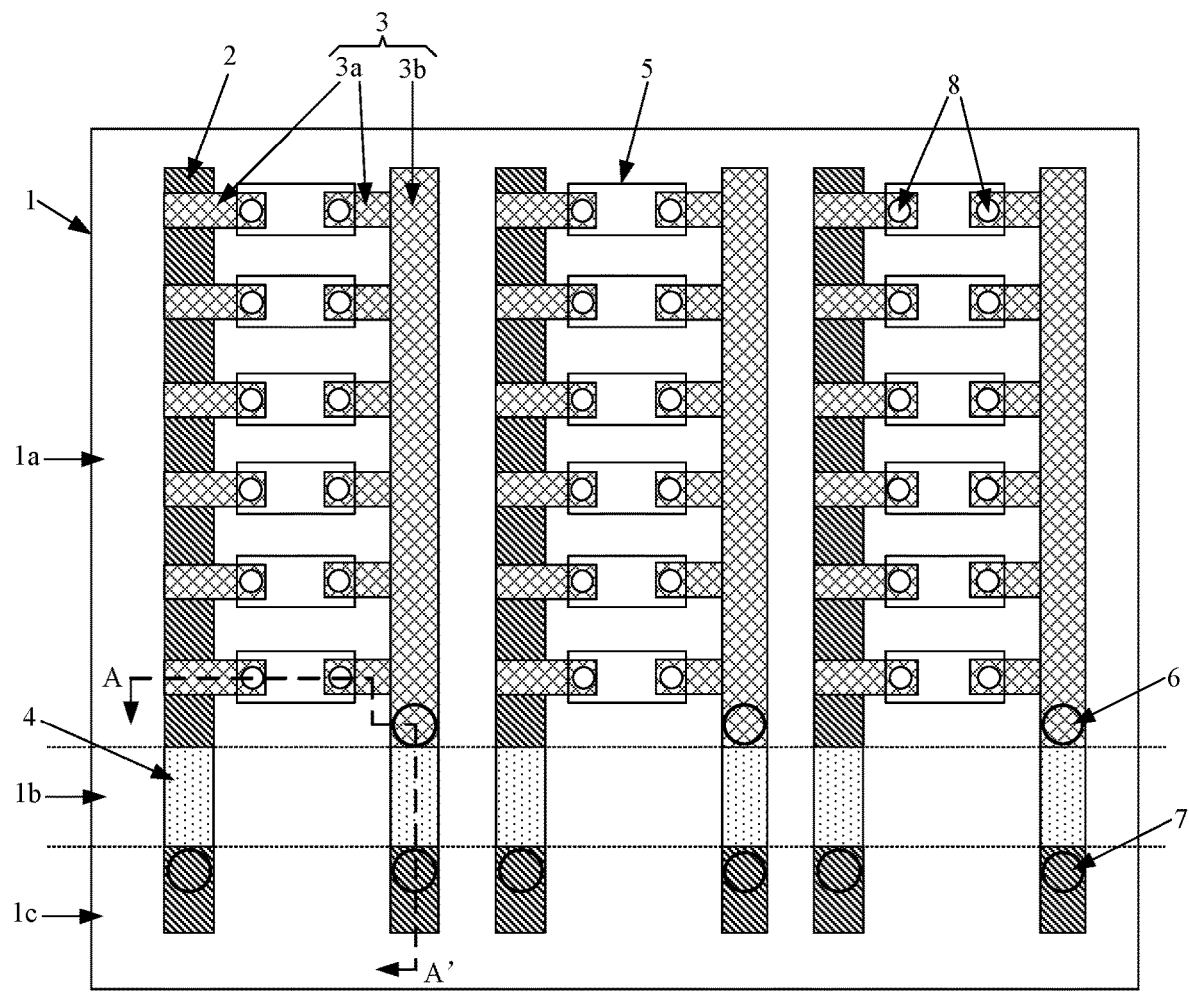
FIG. 1 is a top view of a driving substrate according to an embodiment of the disclosure.
Figure 2:
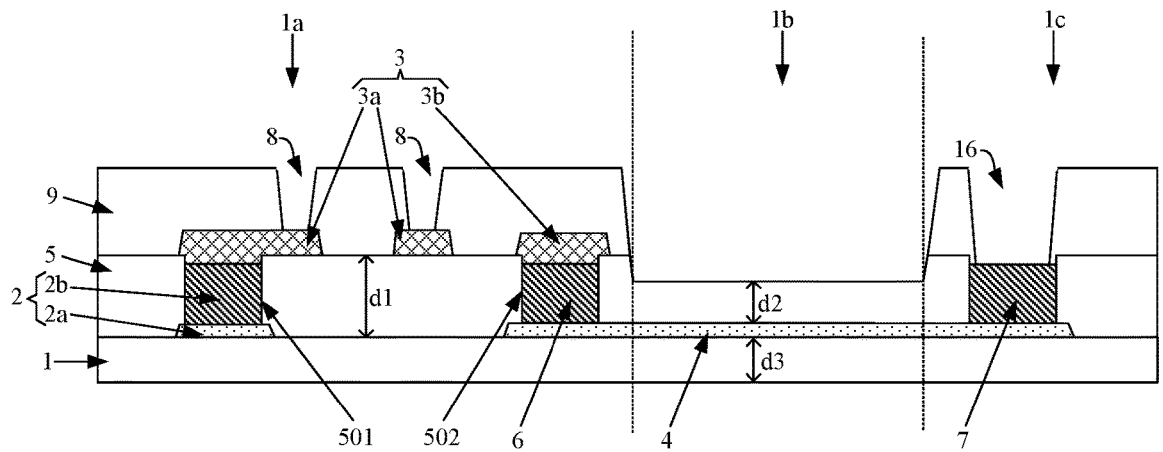
FIG. 2 is a schematic cross-sectional view taken along line A-A' of FIG. 1.

FIG. 1 is a top view of a driving substrate according to an embodiment of the disclosure, and FIG. 2 is a schematic cross-sectional view along line A-A' in FIG. 1. As shown in FIG. 1, the driving substrate includes a flexible substrate 1, a first conductive layer, a flexible insulating layer 5, a second conductive layer 3 and a planarization layer 9.

The flexible substrate 1 includes a display region 1a and a bendable region 1b, and the material of the flexible substrate 1 may include polyimide. In some embodiments, a thickness d3 of the flexible substrate 1 is within a range from about 3 μm to about 10 μm. In addition, the flexible substrate 1 further includes a bonding region 1c at a side of the bendable region 1b far away from the display region 1a.

The first conductive layer is located on the flexible substrate 1, and the first conductive layer includes a first wire 2 in the display region 1a and a connection wire 4 at least partially located in the bendable region 1b. The first wires 2 are signal lines arranged in the display region 1a for providing conductive channels for other electrical structures. A portion of the connection wire 4 is arranged in the bendable region 1b, two ends of the connection wire 4 respectively extend to the display region 1a and the bonding region 1c, and the connection wire 4 is used for providing a signal channel for a conductive structure in the display region 1a and a conductive structure in the bonding region so as to transmit, to the conductive structure in the display region 1a, an electric signal of a flexible circuit board or an integrated circuit connected with the conductive structure in the bonding region.

The flexible insulating layer 5 includes a first insulation pattern in the display region 1a and a second insulation pattern in the bendable region 1b, the first insulation pattern has a first opening 501 in which the first wire 2 is located, the second insulation pattern is located at a side of the connection wire 4 far away from the flexible substrate 1, a thickness of a portion of the second insulation pattern covering the connection wire is d2, d2≥2 μm, and |d2−d3|≤3 μm.

In some embodiments, the flexible insulating layer 5 is made of an organic insulating material, such as polyamide, polyurethane, phenolic resin, polysiloxane, etc., and the flexible insulating layer 5 not only has good insulation property but also has good flexibility. The thickness d1 of the first insulation pattern is within a range from 5 μm to 10 μm.

The second conductive layer 3 is located at a side of the flexible insulating layer 5 far away from the flexible substrate 1. In some embodiments, the second conductive layer 3 may include a first connection terminal (or bonding pad) 3a, and a surface of the first connection terminal 3a far away from the flexible substrate 1 is partially exposed for mounting and fixing the light emitting element 5. The material of the first connection terminal 3a includes copper, and a thickness the first connection terminal 3a is within a range from 6000 Å to 5 μm.

In practical applications, the conductive structure included in the first conductive layer may be configured to be electrically connected to or insulated from the conductive structure included in the second conductive layer 3, and the particular structures of the first conductive layer and the second conductive layer 3 may be designed in advance according to actual needs, which is not limited in the technical solution of the present disclosure, and will be described exemplarily in the following in conjunction with specific embodiments.

The planarization layer 9 is located at a side of the second conductive layer 3 far away from the flexible substrate 1, and has a hollow structure in the bendable region 1b. In some embodiments, the planarization layer 9 is made of an organic insulating material, such as polyamide, polyurethane, phenolic resin, polysiloxane, and the like. The planarization layer 9 can provide a flat surface, which is convenient for the subsequent installation and fixation of the light-emitting element 5, and the light emitting element 5 may be a light emitting device such as a Micro-LED or a Mini-LED.

Referring to FIG. 2, in the bendable region 1b, the driving substrate according to the embodiment of the disclosure includes a flexible substrate 1, a connection wire 4, and a flexible insulating layer 5 (a second insulating pattern) stacked in order, and has a simple structure and a smaller overall thickness, which facilitates the bending. Meanwhile, since the thickness d2 of the portion of the second insulating pattern covering the connection wire 4 is close to the thickness d3 of the flexible substrate 1 (the absolute value of the thickness difference between the two is less than or equal to 3 μm), when the bendable region 1b is bent, a force on the connection wire 4, which is generated by the flexible substrate 1 due to the bending, can be completely or partially counteracted with a force on the connection wire 4, which is generated by the second insulating pattern due to the bending, that is, the connection wire 4 is in the bending stress neutral region or close to the bending stress neutral region, so that the connection wire 4 can be effectively prevented from being broken due to overlarge bending stress.

Also, the condition d2≥2 μm is required for considering that the whole driving substrate is stressed uniformly as much as possible during the led chip bonding process.

In some embodiments, the first wire 2 includes a seed pattern 2a and a growth line 2b at a side of the seed pattern 2a far away from the flexible substrate 1, and the seed pattern 2a is provided in the same layer as the connection wire 4.

In the embodiment of the present disclosure, the seed pattern 2a is formed through a sputtering process and a patterning process, and a position of the seed pattern defines a region where the first wire 2 can be formed. The growth line 2b is formed on the seed pattern 2a through the electroplating process, and may be formed to have a thickness larger than 2 micrometers through the electroplating process. With the seed pattern 2a and the growth line 2b together constituting the first wire 2, the overall resistance of the first wire 2 can be reduced, and the overall conductivity of the first wire 2 can be enhanced, thereby guaranteeing the display quality.

The seed pattern 2a and the growth line 2b may be made of the same material or different materials. The seed pattern 2a may have a single-layer structure or a multi-layer structure (which will be described below). It should be noted that the formation position of the growth line 2b is defined by the seed pattern 2a and the first opening 501 in the first insulating pattern, and thus the first opening 501 should be located in the region where the seed pattern 2a is located. In addition, to ensure that the growth line 2b is always positioned directly above the seed pattern 2a, the thickness d1 of the first insulation pattern should be greater than or equal to the thickness of the growth line 2b, i.e., the growth line 2b is formed within the first opening 501.

As an alternative embodiment, the seed pattern 2a is a laminated structure, for example, the seed layer includes a first sub-conductive layer (not shown) having certain toughness to enable the seed pattern 2a to be bent and a second sub-conductive layer (not shown) having good conductive performance, and the material of the first sub-conductive layer includes molybdenum, a molybdenum alloy, titanium, a titanium alloy, indium gallium zinc oxide (IGZO), indium zinc oxide (IZO), gallium zinc oxide (GZO), indium tin oxide (ITO), and the like, and the material of the second sub-conductive layer includes gold or copper. The first sub-conductive layer has a thickness from 200 Å to 400 Å, e.g., 300 Å, and the second sub-conductive layer has a thickness from 6000 Å to 9000 Å, e.g., 9000 Å. In some embodiments, the material of the growth layer includes copper, and the thickness of the growth layer is within a range from 5 μm to 10 μm. Of course, the seed pattern 2a may also have a three-layer laminated structure or a laminated structure of more layers.

In some embodiments, the planarization layer 9 is formed with a second opening 8 exposing at least a portion of the surface of the first connection terminal 3a at a region where the first connection terminal 3a is located, and the first connection terminal 3a is used for mounting and fixing the light emitting element 5.

It should be noted that FIG. 1 only exemplarily illustrates that the light emitting elements 5 in the same column are electrically connected to two signal lines to form a parallel structure, and one of the two signal lines is the first wire 2, the other is a second wire 3b in the second conductive layer 3, and the second wire 3b is electrically connected to the connection wire 4 through a via hole 502 in which a conductive via pattern 6 is formed. The structure of the display region 1a shown in FIG. 1 is only an optional embodiment in the present disclosure, and in practical applications, the conductive structures included in the first conductive layer and the second conductive layer 3 in the display region 1a may be designed according to actual needs.

In addition, the first conductive layer further includes a second connection terminal 7, the second connection terminal 7 is located in the bonding region 1c, and a third opening 16 exposing a portion of the surface of the second connection terminal 7 is formed at a position in the planarization layer 9 corresponding to the second connection terminal. The second connection terminal 7 is used for bonding the display substrate to a pin of a flexible circuit board or an integrated circuit.

In practical application, the finished product of the driving substrate is obtained by cutting a large-size mother board. In the cutting of a large-size mother board, the large-size mother board needs to be placed on a working platform of a cutting apparatus with a front surface (a side of the flexible substrate 1 on which the first conductive layer, the flexible insulating layer 5, the second conductive layer 3, the planarization layer 9, and the like are formed) of the large-size mother board in contact with the working platform, and then cutting is performed (generally, laser cutting is adopted). Because the outermost layer of the large-size motherboard is the planarization layer 9, which is generally made of an organic material and has poor wear resistance, when the large-size motherboard is placed on a working platform with the front surface of the large-size motherboard in contact with the working platform, or the driving substrate obtained after cutting is taken off from the working platform, the planarization layer 9 is particularly prone to rub against the working platform, which would leads to the wear of the planarization layer 9.

Figure 3:
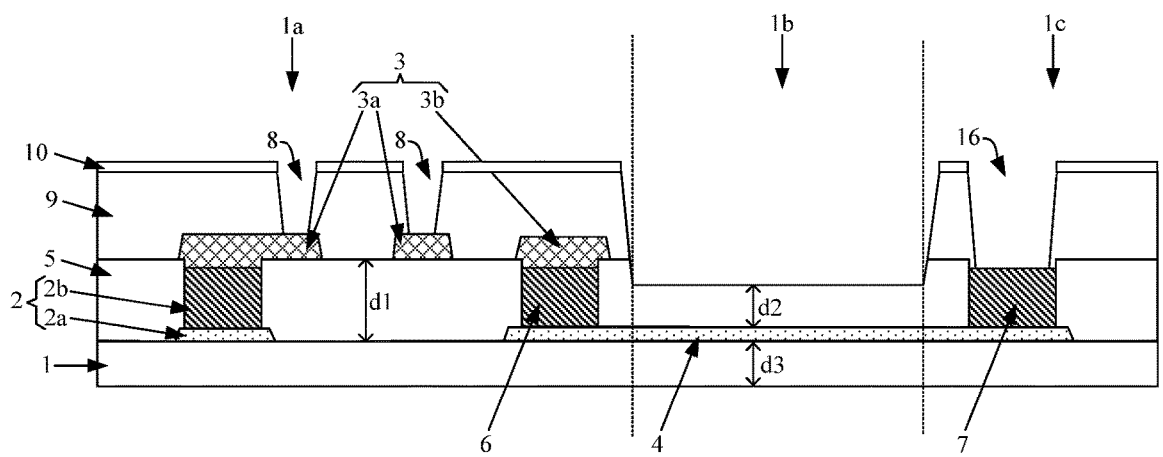
FIG. 3 is another schematic cross-sectional view of a driving substrate according to an embodiment of the present disclosure.

In order to solve the above technical problem, embodiments of the present disclosure provide a novel driving substrate. FIG. 3 is another schematic cross-sectional view of a driving substrate according to an embodiment of the disclosure. As shown in FIG. 3, it is different from the driving substrate shown in FIG. 2 that a protection layer 10 is further disposed in the driving substrate shown in FIG. 3, the protection layer 10 is located at a side of the planarization layer 9 far away from the flexible substrate 1, and the protection layer 10 has a hollow structure in the bendable region 1b.

By providing the protection layer 10, the surface wear resistance of the large-size mother board/driving substrate can be effectively improved, so as to prevent the planarization layer 9 from being worn in the process of cutting the large-size mother board. In addition, since the protection layer 10 has a hollow structure in the bendable region 1b, the whole structure of the bendable region 1b is not affected by the protection layer 10.

In some embodiments, the hardness of the flexible insulating layer 5 is not more than about 1 GPa, e.g., is about 0.4 GPa, while the hardness of the protection layer 10 is more than 20 GPa. The protection layer 10 is made of a hard material, for example, an inorganic hard material such as silicon oxide, silicon nitride, or silicon oxynitride. For example, the hardness of silicon nitride is about 30 GPa.

Figure 4:
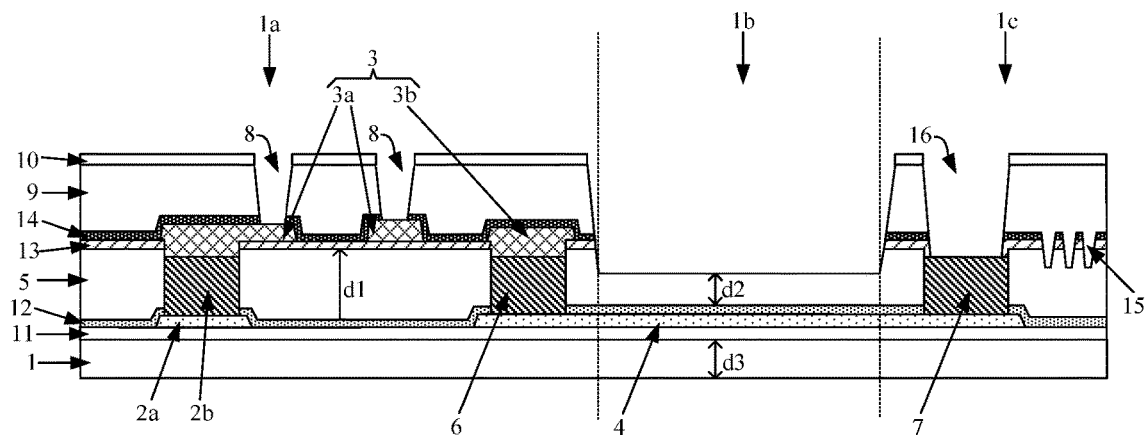
FIG. 4 is another schematic cross-sectional view of a driving substrate according to an embodiment of the disclosure.

FIG. 4 is a schematic cross-sectional view of a driving substrate according to an embodiment of the disclosure, and as shown in FIG. 4, unlike the previous embodiment, the driving substrate provided in this embodiment further includes a buffer layer 11, a first passivation layer 12, a second passivation layer 13, and a third passivation layer 14.

The buffer layer 11 is located between the flexible substrate 1 and the first wire 2, and the buffer layer 11 is laid in a whole layer. In some embodiments, the material of buffer layer 11 includes silicon nitride, silicon oxide or silicon oxynitride, and the buffer layer 11 has a thickness ranging from 1000 Å to 2000 Å. In the embodiment of the present disclosure, by providing the buffer layer 11, an adhesive force of the conductive structure in the first conductive layer on the flexible substrate 1 can be effectively increased.

The first passivation layer 12 is located between the flexible insulating layer 5 and the flexible substrate 1, and a fourth opening is formed in the first passivation layer 12 at a position corresponding to the first opening. In practical applications, the seed pattern generally includes a metal material with good conductivity, such as copper, and the metal material with good conductivity are easily oxidized in a high temperature environment (a high temperature environment exists in the preparation of the flexible insulating layer 5). To this end, in the embodiment of the present disclosure, by providing the first passivation layer 12, oxidation of the metal material contained in the seed pattern can be effectively avoided.

In some embodiments, the material of the first passivation layer 12 includes silicon nitride, silicon oxide, or silicon oxynitride, and the thickness of the first passivation layer 12 is from 1000 Å to 2000 Å.

In the actual process of preparing the first passivation layer 12, the patterning process of the first passivation layer 12 may be performed after the patterning process of the flexible insulating layer 5 is completed. That is, when the flexible insulating layer 5 is prepared, the material thin film for forming the first passivation layer 12 is laid in a whole layer, and completely covers the seed pattern to well protect the seed layer. After the patterning process of the flexible insulating layer 5 is completed, the material thin film for forming the first passivation layer 12 is etched by directly using the flexible insulating layer 5 as a mask pattern, so that a fourth opening is formed below the first opening 501, and the pattern of the first passivation layer 12 is obtained. In the embodiment of the present disclosure, no additional mask is needed for the patterning process of the first passivation layer 12.

It should be noted that, since the flexible insulating layer 5 does not form the opening in the bendable region 1b, when the first passivation layer 12 is prepared by using the flexible insulating layer 5 as a mask pattern, the portion of the first passivation layer 12 in the bendable region 1b is remained. However, since the first passivation layer 12 is usually made of an inorganic material, the first passivation layer does not generate a force on an adjacent structure due to bending deformation after being bent, so that the connection wire 4 is still in a bending stress neutral region or close to the bending stress neutral region even though the first passivation layer 12 exists in the bendable region 1b.

The second passivation layer 13 is located between the flexible insulating layer 5 and the second conductive layer 3, and the second passivation layer 13 has a hollow structure in the bendable region 1b. In practical applications, if the second conductive layer 3 is directly formed on the surface of the flexible insulating layer 5, the structure of the second conductive layer 3 will be peeled off from the flexible insulating layer 5 due to insufficient adhesion. Therefore, in the embodiment of the present disclosure, by disposing the second passivation layer 13 between the flexible insulating layer 5 and the second conductive layer 3, the second passivation layer 13 has good adhesive force with the flexible insulating layer 5 and the second conductive layer 3, so as to improve the firmness of adhesion between the second conductive layer 3 and the structure on the driving substrate. Meanwhile, the second passivation layer 13 has a hollow structure in the bendable region 1b, so that the disposing of the second passivation layer 13 does not affect the overall structure of the bendable region 1b.

In some embodiments, the material of the second passivation layer 13 includes silicon nitride, silicon oxide, or silicon oxynitride, and the thickness of the second passivation layer 13 is from 1000 Å to 2000 Å.

In some embodiments, the second passivation layer 13 has vents 15 formed within the bonding region 1c. Since the organic insulating material used for preparing the flexible insulating layer 5 contains a certain amount of water, and the gas in the process environment during the process of preparing flexible insulating layer 5 enters the flexible insulating layer 5, the interior of the finally-obtained flexible insulating layer 5 contains gas. Since the second conductive layer 3 needs to be prepared in a high temperature environment, and the gas in the flexible insulating layer 5 may overflow under the high temperature environment, if the gas cannot be exhausted in time, a bulge may easily occur on the second passivation layer 13. Therefore, in the embodiment of the present disclosure, the gas in the flexible insulating layer 5 can be exhausted successfully by forming the vents 15 in the second passivation layer 13, and the disposing of the vents 15 in the bonding region 1c can avoid the influence on the structure of the display region 1a.

The third passivation layer 14 is located between the second conductive layer 3 and the planarization layer 9, and the third passivation layer 14 has a hollow structure in the bendable region 1b. In the embodiment of the present disclosure, the third passivation layer 14 is disposed to effectively prevent the intrusion of external moisture, so as to improve the lifetime of the driving substrate. In addition, since the third passivation layer 14 has a hollow structure in the bendable region 1b, the disposing of the third passivation layer 14 does not affect the overall structure of the bendable region 1b.

In some embodiments, the material of the third passivation layer 14 includes silicon nitride, silicon oxide, or silicon oxynitride, and the thickness of the third passivation layer 14 is from 1000 Å to 2000 Å.

It should be noted that, the case where the driving substrate includes all of the buffer layer 11, the first passivation layer 12, the second passivation layer 13, and the third passivation layer 14 as described above is only an optional embodiment in the present disclosure, and does not limit the technical solution of the present disclosure. In practical applications, the driving substrate may also include only any one, two, or three of the buffer layer 11, the first passivation layer 12, the second passivation layer 13, and the third passivation layer 14, and these cases should also fall within the protection scope of the present disclosure.

Figure 5:
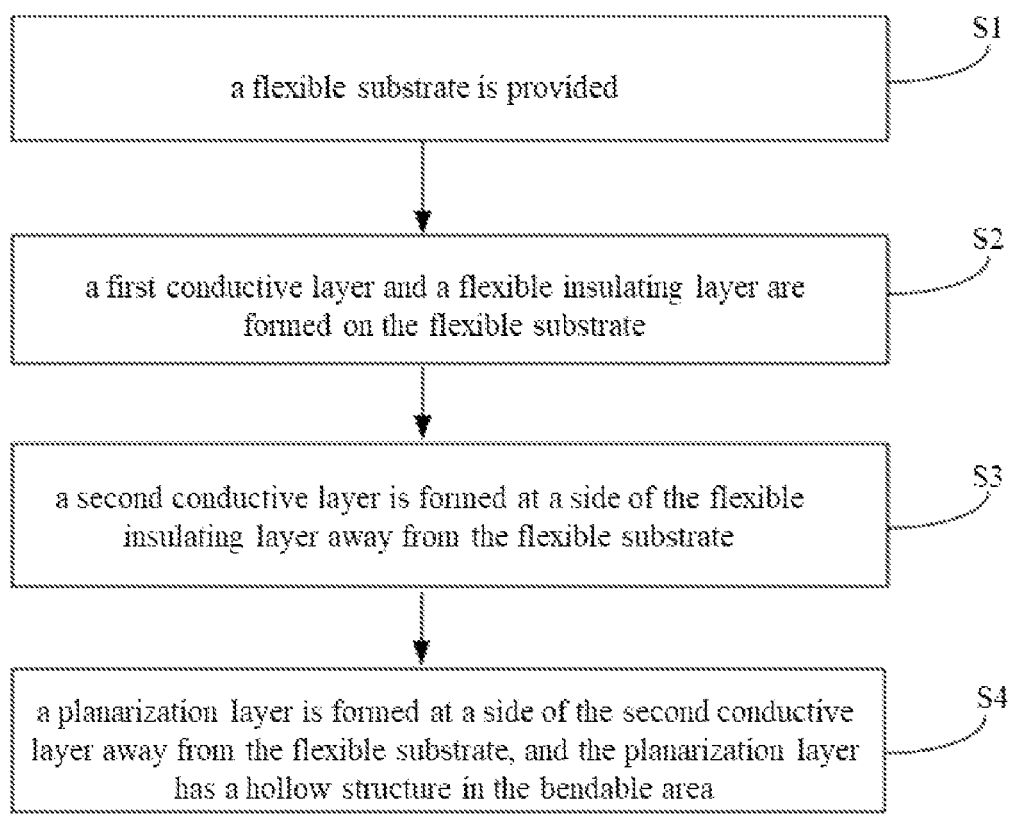
FIG. 5 is a flowchart of a method for manufacturing a driving substrate according to an embodiment of the disclosure.

FIG. 5 is a flowchart of a method for manufacturing a driving substrate according to an embodiment of the disclosure, and as shown in FIG. 5, the method may be used to manufacture the driving substrate according to the previous embodiment, for example, the method for manufacturing the driving substrate shown in FIG. 2 includes steps S1 to S4.

At step S1, a flexible substrate is provided.

The material of the flexible substrate includes polyimide, and the thickness of the flexible substrate ranges from 3 μm to 10 μm, and the flexible substrate may be divided into a display region, a bendable region, and a bonding region.

In some embodiments, the flexible substrate is on a rigid substrate (e.g., a glass substrate) to prevent deformation of the flexible substrate during the manufacturing process of the driving substrate. After the manufacturing process of all the film layers of the driving substrate is completed, the portion of the rigid substrate in the bendable region can be removed by using a laser or cutting method, or the rigid substrate can be completely peeled off, so that the bendable region can be bent.

At step S2, a first conductive layer and a flexible insulating layer are formed on the flexible substrate.

The first conductive layer includes a first wire in the display region and a connection wire at least partially in the bendable region, and the flexible insulating layer includes a first insulation pattern in the display region and a second insulation pattern in the bendable region, the first insulation pattern has a first opening in which the first wire is located, the second insulation pattern is positioned at a side of the connection wire far away from the flexible substrate, and the thickness of the portion of the second insulation pattern covering the connection wire is equal to that of the flexible substrate.

At step S3, a second conductive layer is formed at a side of the flexible insulating layer far away from the flexible substrate.

At step S4, a planarization layer is formed at a side of the second conductive layer far away from the flexible substrate, and the planarization layer has a hollow structure in the bendable region.

Figure 6:
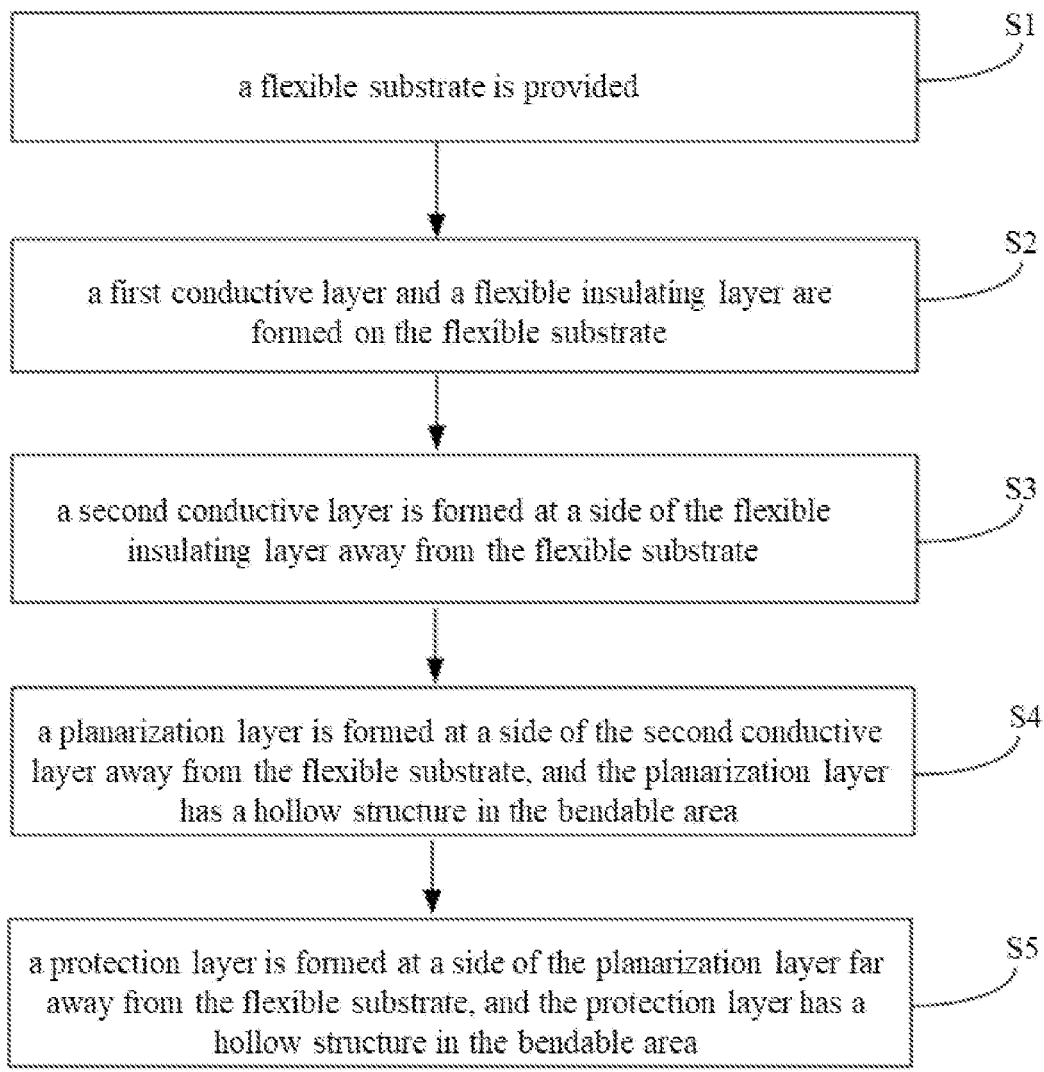
FIG. 6 is a flowchart of another method for manufacturing a driving substrate according to an embodiment of the disclosure.

FIG. 6 is a flowchart of another method for manufacturing a driving substrate according to an embodiment of the present disclosure, and as shown in FIG. 6, the method may be used to manufacture the driving substrate shown in FIG. 3, and in addition to the above steps S1 to S4, further includes step S5 after step S4. The following detailed description is made only for step S5.

At step S5, a protection layer is formed at a side of the planarization layer far away from the flexible substrate, and the protection layer has a hollow structure in the bendable region.

In some embodiments, step S5 specifically includes: step S501 and step S502.

At step S501, a protection material thin film is formed at a side of the planarization layer far away from the flexible substrate.

At step S502, a patterning process is performed on the protection material thin film to obtain a pattern of the protection layer.

In step S502, the protective material thin film is patterned.

In the actual production process, after step s501, the large-size mother board may be cut to obtain a plurality of medium-size substrates (also referred to as q substrates, which generally each include 2 driving substrate units). Thereafter, the process of step S502 is performed for each Q substrate. After step S502 is finished, the Q substrate is cut to obtain a single driving substrate unit.

The patterning process in step S502 may be a dry etching process or a screen printing etching process. Because the etching equipment of the dry etching process is mainly matched with a large-size mother board for large-region etching, in order to realize the dry etching of the Q substrate, certain improvement on the existing etching equipment or re-purchase of an etching equipment suitable for the medium-size substrate is required, which may increase the manufacturing cost. Therefore, the protection material thin film on the Q substrate can be patterned by adopting a screen-printing etching method, and the size of the substrate is not limited by the screen-printing etching process. Specifically, the etching paste is printed on the region from which the protection material thin film will be removed by a screen printing method, and the etching paste can etch the protective material thin film directly therebelow, so that the pattern of the protection layer is obtained.

Figure 7:
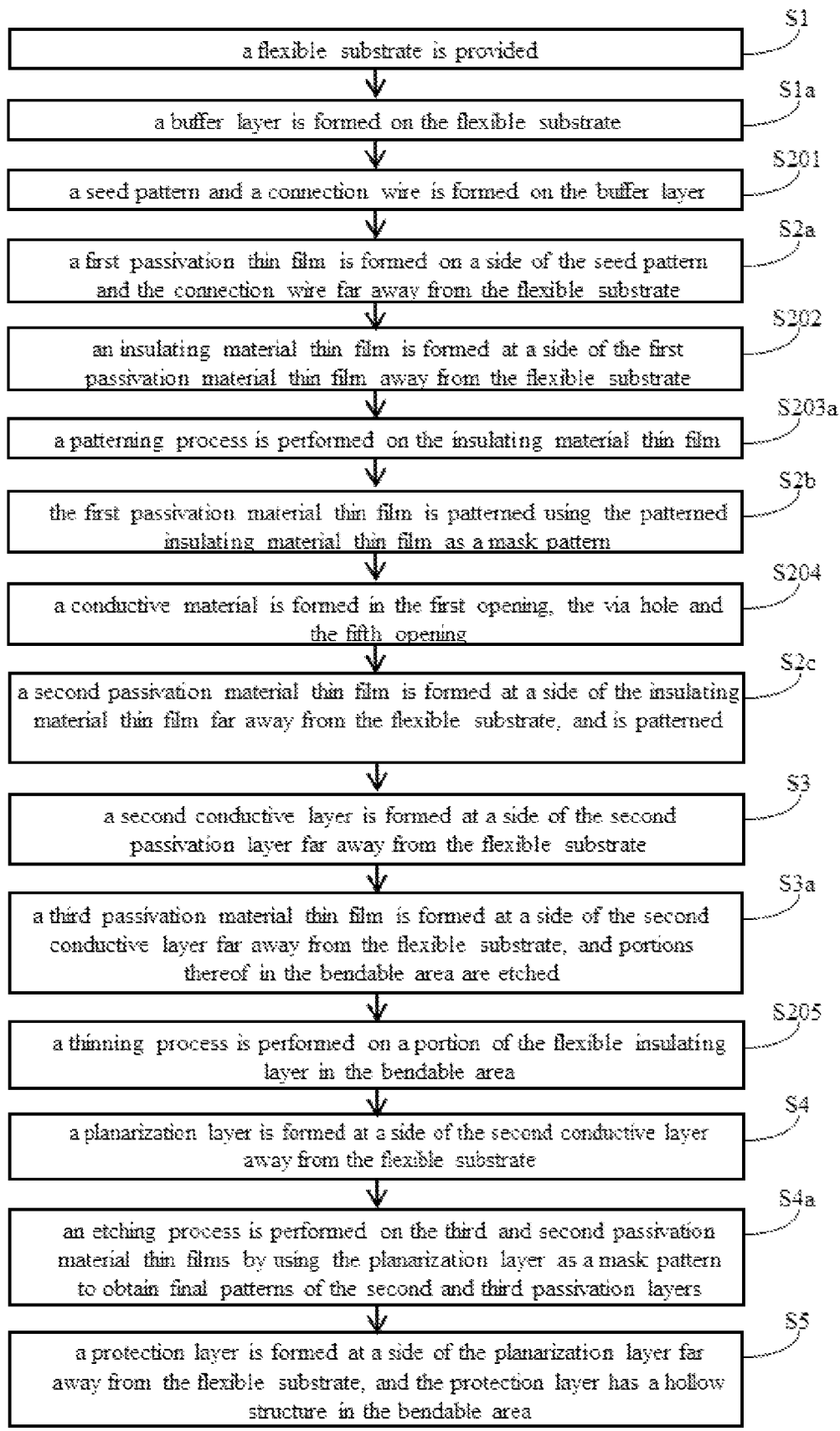
FIG. 7 is a flowchart of still another method for manufacturing a driving substrate according to an embodiment of the disclosure.
Figure 8A:
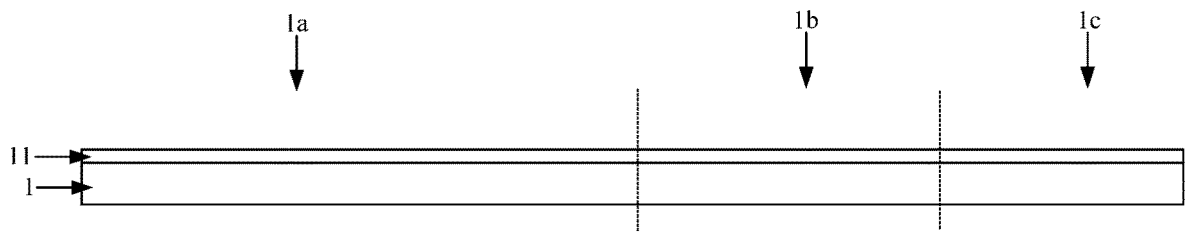
FIGS. 8a to 8l are schematic diagrams illustrating intermediate structures of a driving substrate manufactured by the manufacturing method of FIG. 7.
Figure 8B:
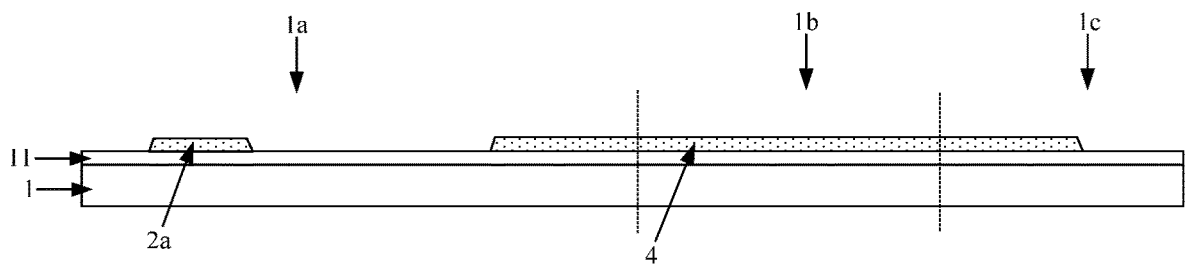
Figure 8C:
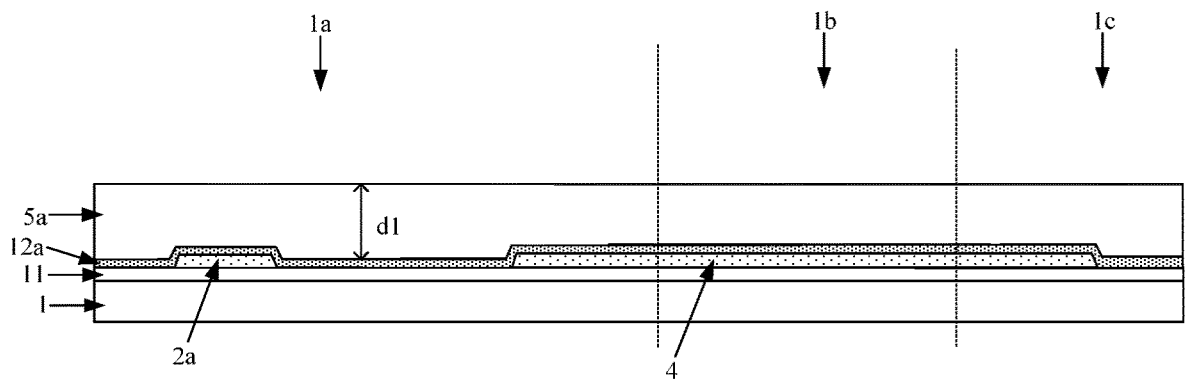
Figure 8D:
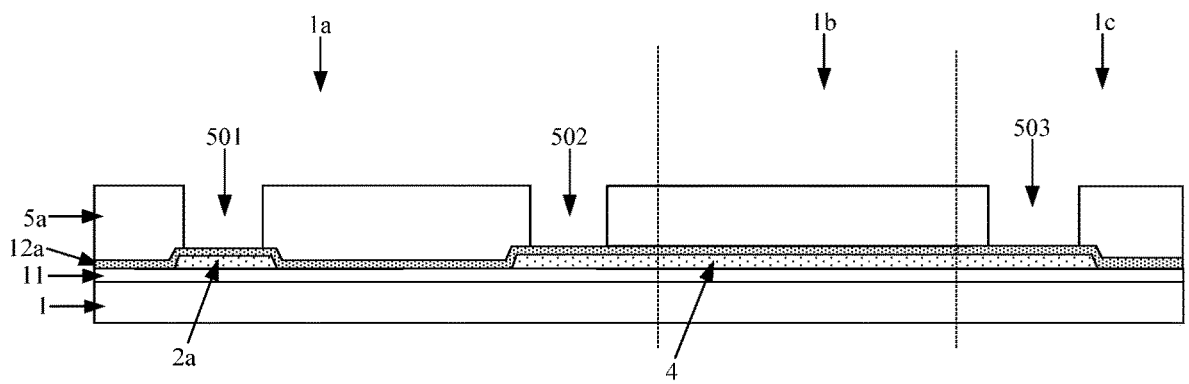
Figure 8E:
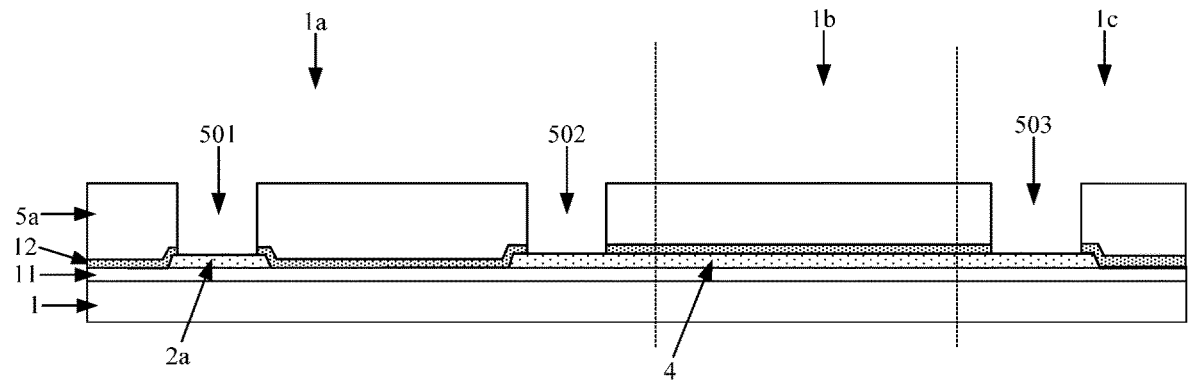
Figure 8F:
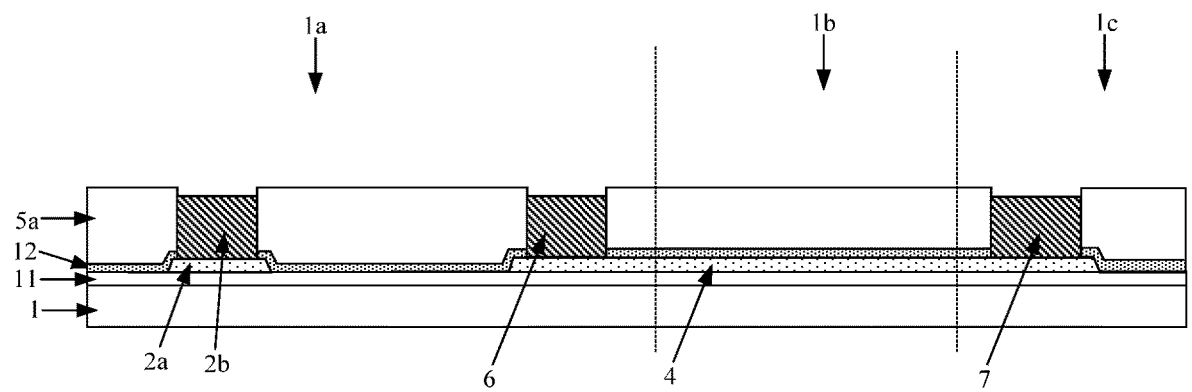
Figure 8G:
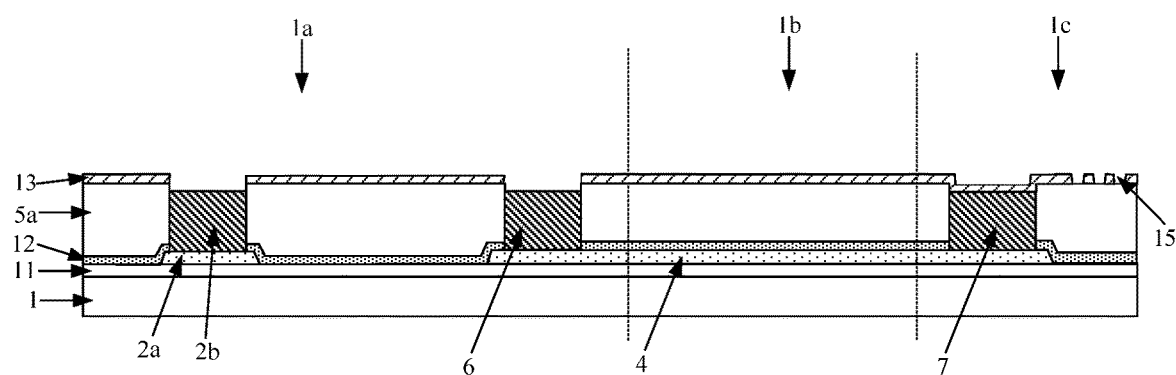
Figure 8H:
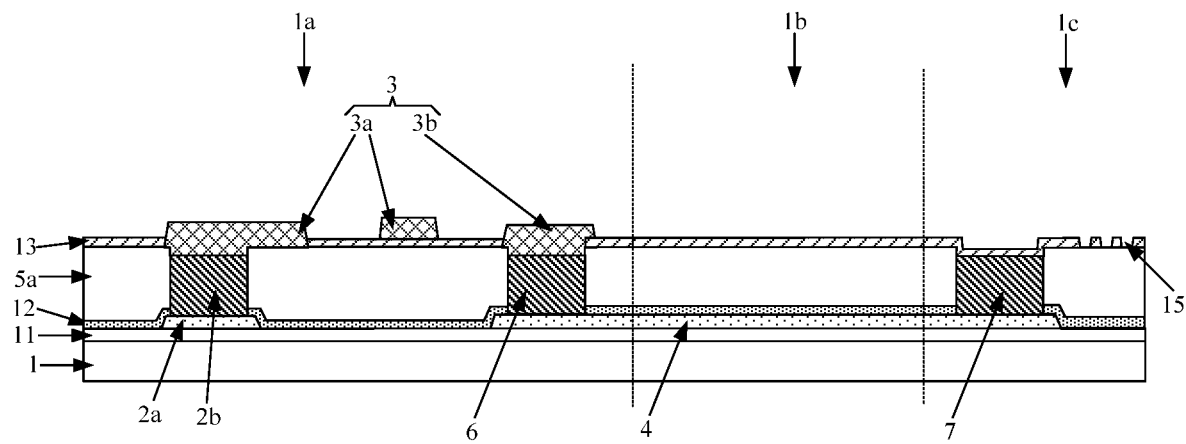
Figure 8I:
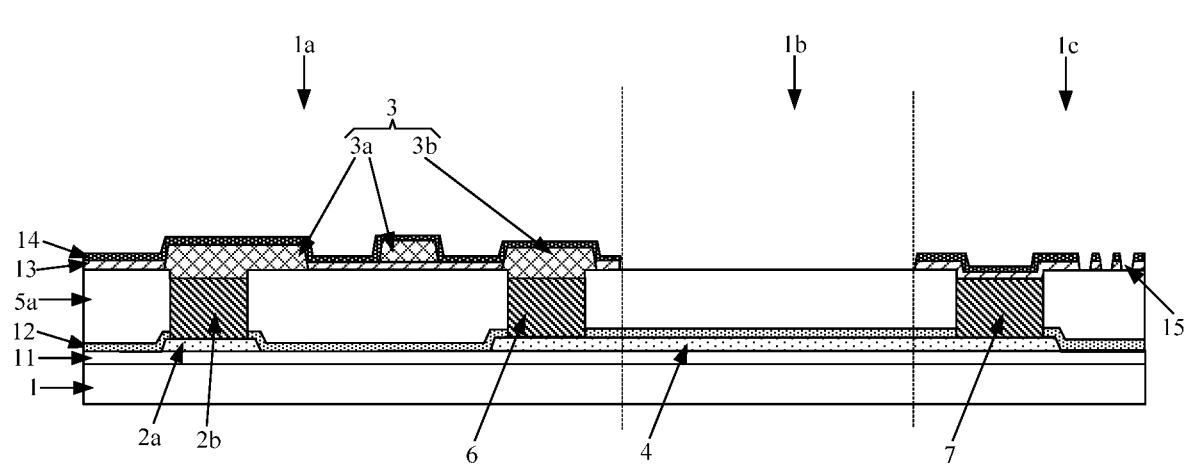
Figure 8J:
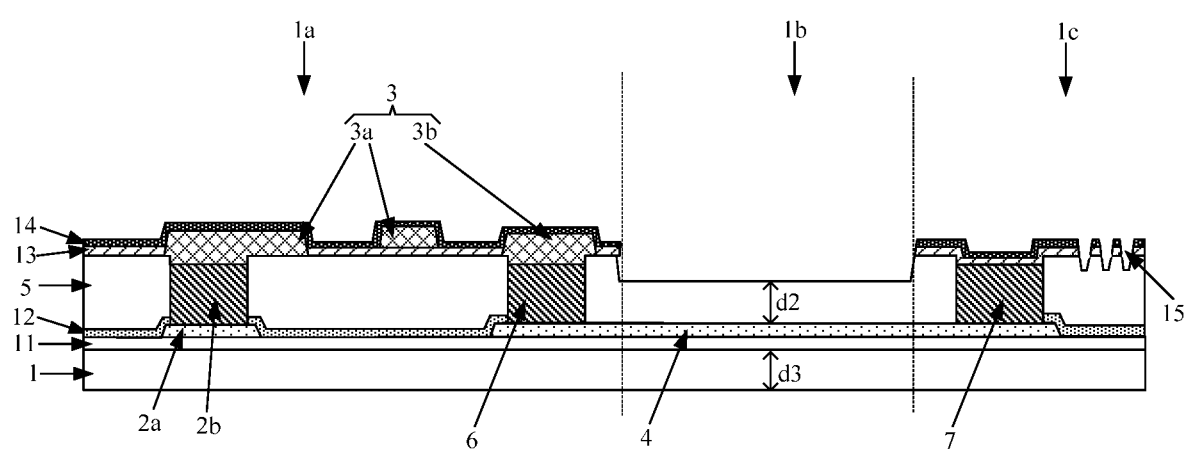
Figure 8K:
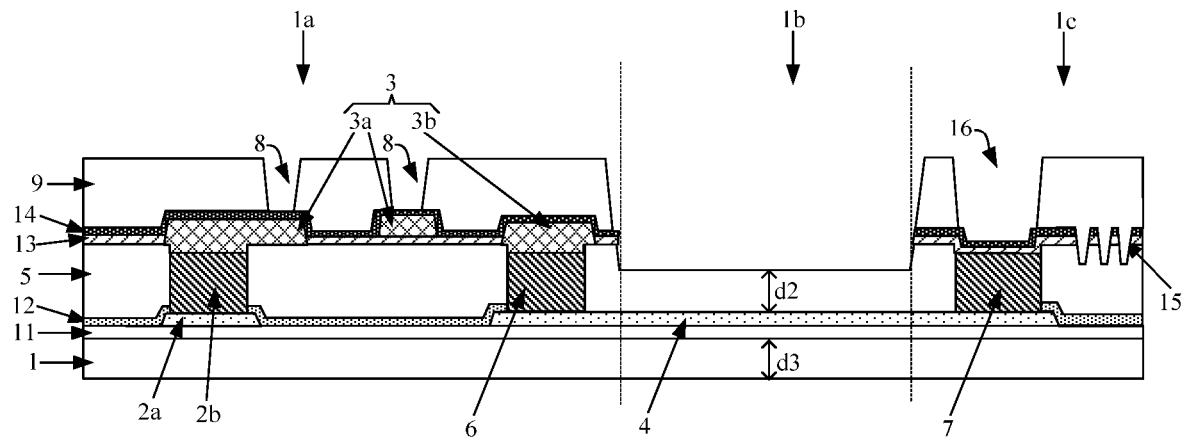
Figure 8L:
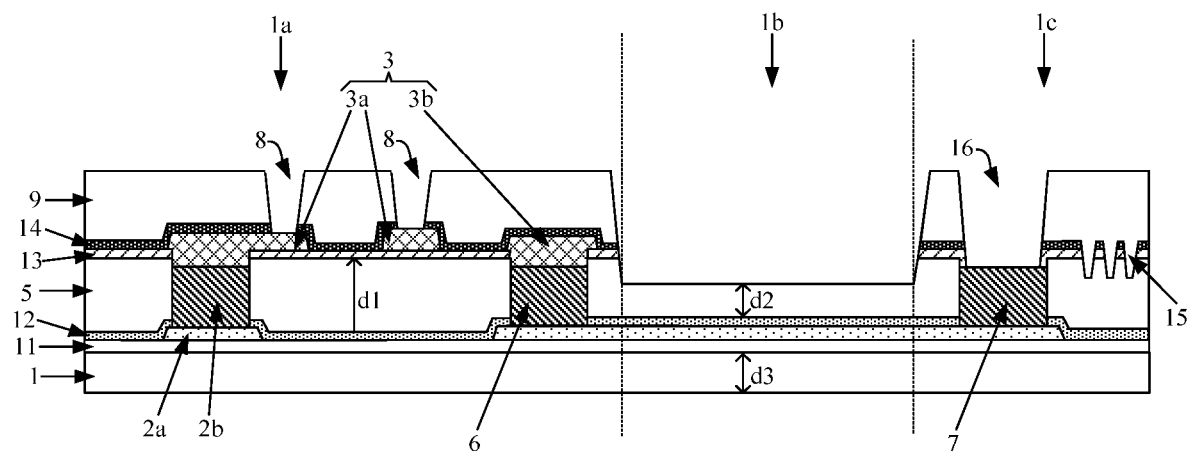

FIG. 7 is a flowchart of another method for manufacturing a driving substrate according to an embodiment of the present disclosure, and FIGS. 8a to 8l are schematic diagrams illustrating intermediate structures of the driving substrate manufactured by the manufacturing method shown in FIG. 7, and as shown in FIGS. 7 to 8l, the manufacturing method may be used for manufacturing the driving substrate shown in FIG. 4, and the manufacturing method includes steps S1, S1a, S201, S2a, S202, S203a, S2b, S204, S2c, S3, S3a, S205, S4, S4a, S5.

At step S1, a flexible substrate is provided.

At step S1a, a buffer layer is formed on the flexible substrate.

Referring to FIG. 8a, the flexible substrate 1 includes a display region 1a, a bendable region 1b, and a bonding region 1c. The buffer layer 11 is laid in the whole layer. The flexible substrate 1 may be positioned on a rigid substrate (not shown) to prevent deformation of the flexible substrate 1 during a subsequent manufacturing process.

At step S201, a seed pattern and a connection wire are formed on the buffer layer.

Referring to FIG. 8b, a seed material thin film (which may be a single-layer structure or a multi-layer structure) is formed on the surface of the flexible substrate shown in FIG. 8a through a deposition process, and then a patterning process is performed on the seed material thin film to obtain a seed pattern 2a and a connection wire 4. The connection wires 4 are located in the bendable region 1b, and both ends thereof extend to the display region 1a and the bonding region 1c, respectively.

In some embodiments, the seed material thin film includes a first sub-conductive material thin film and a second sub-conductive material thin film at a side of the first sub-conductive material thin film far away from the flexible substrate 1. The material of the first sub-conductive material thin film includes at least one of molybdenum, molybdenum alloy, titanium, titanium alloy, indium gallium zinc oxide, indium zinc oxide, gallium zinc oxide and indium tin oxide, and the thickness thereof is within a range from 200 Å to 400 Å. The material of the second sub-conductive material thin film includes gold or copper, and the thickness thereof is within a range from 6000 Å to 9000 Å.

At step S2a, a first passivation thin film is formed at a side of the seed pattern and the connection wire far away from the flexible substrate.

At step S202, an insulating material thin film is formed at a side of the first passivation material thin film far away from the flexible substrate.

Referring to FIG. 8c, the material of the first passivation material thin film 12a includes silicon nitride, silicon oxide or silicon oxynitride, the first passivation material thin film 12a may be formed by a deposition process to have a thickness within a range from 1000 Å to 2000 Å.

The material of the insulating material thin film 5a includes at least one of polyamide, polyurethane, phenolic resin, polysiloxane, and the insulating material thin film 5a may be formed by a coating process. The thickness of the insulating material thin film 5a is larger than that of the flexible substrate 1, and the thickness d1 of the insulating material thin film 5a is within a range from 5 μm to 10 μm.

At step S203a, a patterning process is performed on the insulating material thin film, a portion of the insulating material thin film in the display region is the first insulating pattern, and a portion of the insulating material thin film in the bendable region is completely retained.

Referring to FIG. 8d, a first opening 501 and a via hole 502 may be formed in the display region 1a, and a fifth opening 503 may be formed in the bonding region 1c. The first opening 501 corresponds to the seed pattern 2a and is configured to accommodate a growth line 2b to be formed subsequently, the via hole 502 corresponds to one end of the connection wire 4 and is configured to accommodate a conductive via pattern 6 to be formed subsequently, and the fifth opening 503 corresponds to the other end of the connection wire 4 and is configured to accommodate the second connection terminal 7 to be formed subsequently. In step S203a, the portion of the insulating material thin film 5a in the bendable region 1b is completely retained. The seed pattern 2a and the growth line 2b which are stacked constitute the first wire 2.

At step S2b, the first passivation material thin film is patterned using the patterned insulating material thin film as a mask pattern to obtain the pattern of the first passivation layer.

Referring to FIG. 8e, the dry etching process of the first passivation material thin film is performed using the patterned insulating film 5a as a mask pattern. At this time, the seed pattern 2a is exposed through the first opening 501, and the two ends of the connection wire 4 are also exposed through the via hole 502 and the fifth opening 503, respectively. In step S2b, since the patterned insulating material thin film 5a is used as a mask pattern for the patterning process of the first passivation layer 12, no additional mask pattern is required, and the manufacturing cost can be effectively reduced.

At step S204, a conductive material is formed in the first opening, the via hole and the fifth opening.

Referring to FIG. 8f, a conductive material is formed in the first opening 501, the via hole 502, and the fifth opening 503 through an electroplating process to obtain the growth line 2b, the conductive via pattern 6, and the second connection terminal 7.

In some embodiments, the conductive material includes copper, and the thicknesses thereof is within a range from 5 μm to 10 μm.

The thickness of the conductive material formed in step S204 should be less than or equal to the thickness of the insulating material thin film 5a in step S202.

At step S2c, a second passivation material thin film is formed at a side of the insulating material thin film far away from the flexible substrate, and the second passivation material thin film is patterned to obtain a second passivation layer.

Referring to FIG. 8g, the material of the second passivation material thin film includes silicon nitride, silicon oxide or silicon oxynitride, and the second passivation material thin film may be formed by a deposition process to have a thickness ranging from 1000 Å to 2000 Å. The second passivation thin film is patterned to expose the conductive via pattern 6 and partial regions of the first wire 2, and to form vents 15 in the bonding region 1c, thereby obtaining the pattern of a second passivation layer 13. In this process, the portion of the second passivation thin film in the bendable region 1b may be temporarily retained.

At step S3, a second conductive layer is formed at a side of the second passivation layer far away from the flexible substrate.

Referring to FIGS. 1 and 8h, a second conductive material thin film is first formed through a deposition process, and then a patterning process is performed on the second conductive material thin film to obtain the pattern of the second conductive layer 3. The second conductive layer 3 includes a first connection terminal 3a and a second wire 3b, a portion of the first connection terminal 3a is connected to the first wire 2 through the opening in the second passivation layer 13, and a portion of the first connection terminal 3a is connected to the second wire 3b.

In some embodiments, the material of the second conductive material thin film includes copper, and the thicknesses thereof is within a range from 6000 Å to 5 μm.

At step S3a, a third passivation material thin film is formed at a side of the second conductive layer far away from the flexible substrate, and portions of the second passivation material thin film and the third passivation material thin film in the bendable region are etched.

Referring to FIG. 8i, the material of the third passivation material thin film includes silicon nitride, silicon oxide or silicon oxynitride, and the third passivation material thin film may be formed by a deposition process to have a thickness ranging from 1000 Å to 2000 Å. Portions of the second passivation material thin film and the third passivation material thin film in the bendable region 1b and a portion of the third passivation layer 14 at the vents 15 are etched by a dry etching process, so that a portion of the flexible insulating layer 5 in the bendable region 1b, and the vents 15 are exposed.

At step S205, a thinning process is performed on a portion of the flexible insulating layer in the bendable region.

Referring to FIG. 8j, the portion of the flexible insulating material thin film 5a in the bendable region 1b is thinned by a high temperature ashing process, so that the thickness d2 of the portion of the second insulating pattern covering the connection wire 4 is close to the thickness d3 of the flexible substrate 1, and d2≥2 μm.

Since the second conductive layer 3 (the first connection terminal 3a and the second wire 3b) and the second connection terminal 7 are covered by the third passivation thin film, the second conductive layer 3 and the second connection terminal 7 are not oxidized when the portion of the flexible insulating layer 5 in the bendable region 1b is thinned by a high temperature ashing process. In addition, the gas escaping from the flexible insulating layer 5 can be exhausted through the vents 15.

It should be noted that the portion of the insulating material thin film 5a exposed by the vents 15 is also thinned in the ashing process.

At step S4, a planarization layer is formed at a side of the second conductive layer far away from the flexible substrate.

Referring to FIG. 8k, a planarization material thin film is first formed through a coating process, and then a patterning process is performed on the planarization material thin film to remove a portion of the planarization material thin film directly above the first connection terminal 3a (to form a second opening 8), a portion of the planarization material thin film directly above the bendable region 1b (to form a hollow structure), and a portion of the planarization material thin film directly above the second connection terminal 7 (to form the third opening 16).

At step S4a, an etching process is performed on the third passivation material thin film and the second passivation material thin film by using the planarization layer as a mask pattern to obtain final patterns of the second passivation layer and the third passivation layer.

Referring to FIG. 8l, an etching process is performed on the third passivation material thin film and the second passivation material thin film by a dry etching process using the planarization layer 9 as a mask pattern to expose the first connection terminals 3a and the second connection terminals 7 and obtain a final pattern of the second passivation layer 13 and the third passivation layer 14.

At step S5, a protection layer is formed at a side of the planarization layer far away from the flexible substrate, and the protection layer has a hollow structure in the bendable region.

The above-described steps S201, S202, S203a, S204 and S205 are an optional embodiment for implementing the step S2 in FIGS. 5 and 6. The driving substrate shown in FIG. 4 may be manufactured through the above-described steps S1 to S5.

Figure 9:
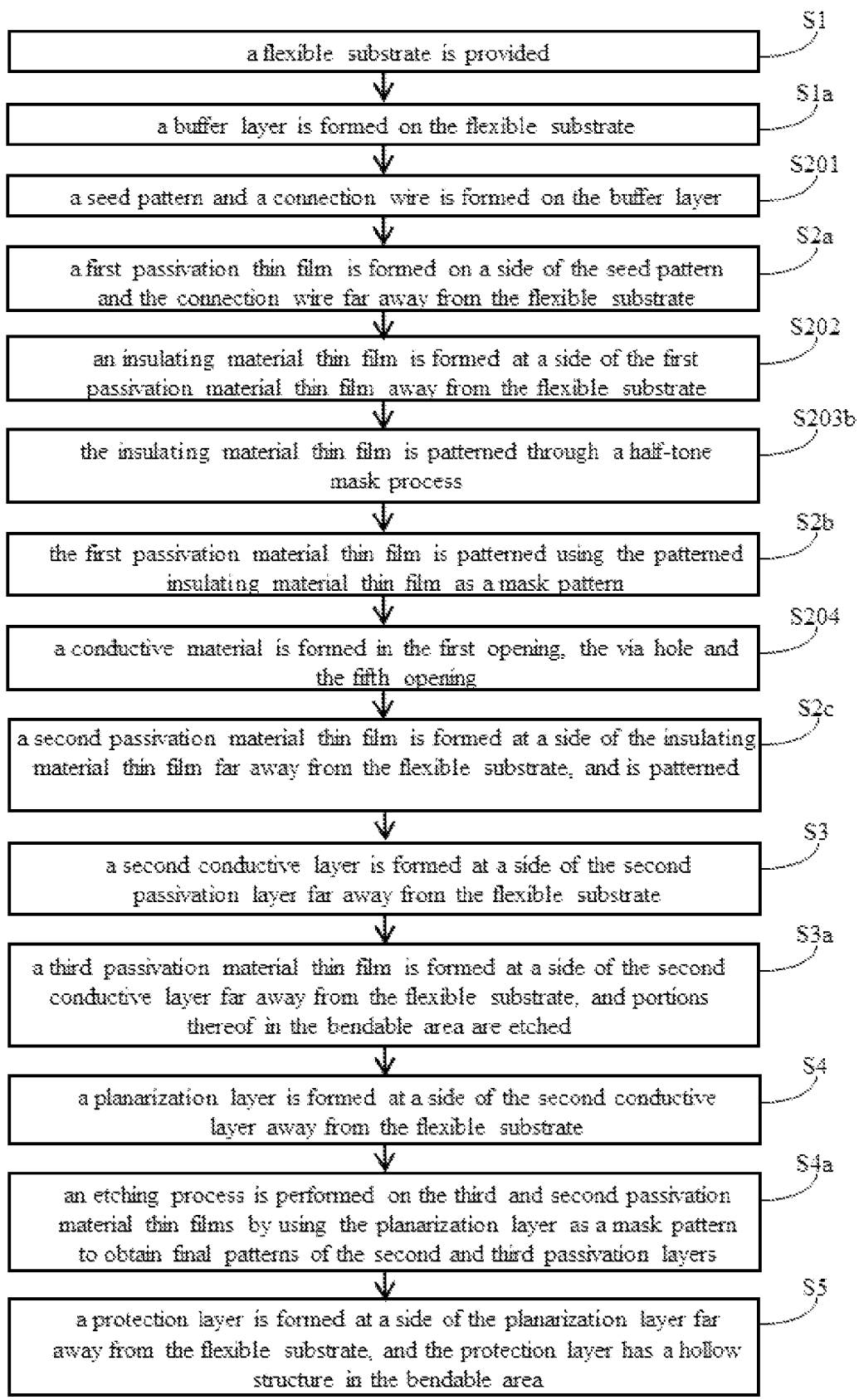
FIG. 9 is a flowchart of yet another method for manufacturing a driving substrate according to an embodiment of the disclosure.
Figure 10:
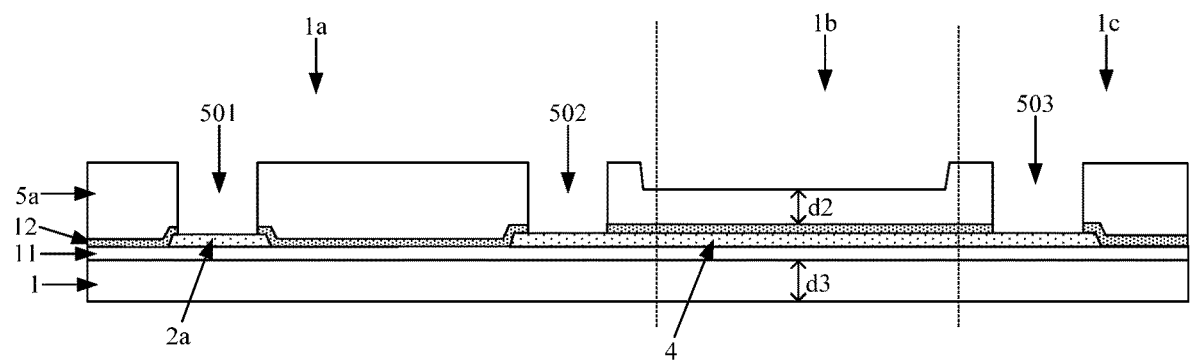
FIG. 10 is a schematic diagram of an intermediate structure when an insulating material thin film is patterned using a halftone mask process according to an embodiment of the disclosure.

FIG. 9 is a flowchart of another manufacturing method of a driving substrate according to an embodiment of the present disclosure, and FIG. 10 is a schematic diagram of an intermediate structure when the insulating material thin film according to an embodiment of the present disclosure is patterned by using a halftone mask process. As shown in FIGS. 9 and 10, unlike the manufacturing method shown in FIG. 7, in this embodiment, step S203a in the manufacturing method shown in FIG. 7 is replaced by step S203b, and step S205 is omitted. The following detailed description is made only for step S203b.

At step S203b, the insulating material thin film is patterned through a half-tone mask process, a portion of the insulating material thin film in a region where the seed pattern is located is completely removed to form a first opening, a portion of the insulating material thin film in the bendable region is partially removed, and a thickness of a portion of the insulating material thin film covering the connection wire is equal to the thickness of the flexible substrate.

Referring to FIG. 10, unlike the previous embodiment in which the portion of the insulating material thin film 5a in the bendable region 1b is thinned by the ashing process, in the embodiment of the present disclosure, the material of the insulating material thin film 5a is made of a photoresist material, and the portion of the insulating material thin film 5a in the bendable region 1b is thinned by a half-tone mask process during the process of forming the first opening 501, so that an absolute value of a thickness difference between a thickness d2 of a portion of the second insulating pattern covering the connection wire 4 and a thickness d3 of the flexible substrate 1 is less than or equal to 3 μm, and d2 is greater than or equal to 2 μm.

It should be noted that, during the patterning process of the first passivation thin film in the subsequent step S2b, the portion of the first passivation thin film located in the bendable region 1b may be removed together.

Steps S201, S202, S203b and S204 shown in FIG. 9 are an alternative embodiment for implementing step S2 in FIGS. 5 and 6.

Figure 11:
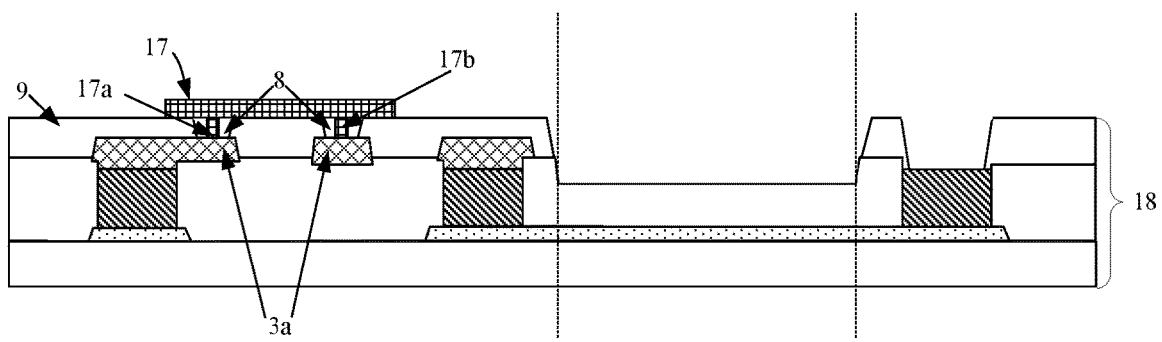
FIG. 11 is a schematic cross-sectional view of a display device according to an embodiment of the disclosure.

FIG. 11 is a schematic cross-sectional view of a display device according to an embodiment of the disclosure, and as shown in FIG. 11, the display device includes a light-emitting element 17 and a driving substrate 18, the light-emitting element 17 is located at a side of the planarization layer 9 far away from the flexible substrate, the light-emitting element 17 has a first electrode 17a and a second electrode 17b, and the first electrode 17a and the second electrode 17b are connected with the conductive structure (the first connection terminal 3a) in the second conductive layer through the via hole (i.e., the second opening 8) in the planarization layer 9.

When the first electrode 17/the second electrode 17b is connected to the first connection terminal 3a, an auxiliary structure (such as solder, conductive adhesive, etc.) may be used for more reliable electrical connection.

It should be noted that FIG. 11 merely illustrates a case where the driving substrate shown in FIG. 2 is used as the driving substrate.

In some embodiments, the light emitting element 17 includes a Micro-LED or a Mini-LED, the first and second electrodes 17a and 17b of the light emitting element are referred to as a cathode and an anode of the Micro-LED/Mini-LED, respectively.

In the present embodiment, the light emitting elements 17 and the driving substrate 18 may form a light source together with other optical structures (e.g., a light guide plate, a diffusion sheet, etc.) to provide light for a display panel in a display device. Alternatively, the light-emitting element 17 and the driving substrate 18 can be directly used as part of the display panel in the display device to display a screen.

In some embodiments, the display device may be any product or component having a display function, such as a mobile phone, a tablet computer, a television, a display, a notebook computer, a digital camera, a navigator, and the like.

It will be understood that the above embodiments are merely exemplary embodiments used to illustrate the principles of the present disclosure, and the present disclosure is not limited thereto. It will be apparent to those skilled in the art that various changes and modifications can be made therein without departing from the spirit and essence of the disclosure, and these changes and modifications are to be considered within the protection scope of the disclosure.

What is claimed is:

1. A driving substrate, comprising:
    a flexible substrate comprising a display region and a bendable region;
    a first conductive layer on the flexible substrate, and comprising a first wire in the display region and a connection wire at least partially in the bendable region;
    a flexible insulating layer, comprising: a first insulation pattern in the display region and having a first opening in which the first wire is located, and a second insulation pattern in the bendable region and at a side of the connection wire far away from the flexible substrate;
    a second conductive layer at a side of the flexible insulating layer far away from the flexible substrate; and
    a planarization layer at a side of the second conductive layer far away from the flexible substrate and having a hollow structure in the bendable region,
    wherein a thickness of a portion of the second insulating pattern covering the connection wire is d2, a thickness of the flexible substrate is d3, d2≥2 μm and |d2-d3|≤3 μm.

2. The driving substrate according to claim 1, wherein the driving substrate is further provided with a protection layer at a side of the planarization layer far away from the flexible substrate and having a hollow structure in the bendable region.

3. The driving substrate according to claim 2, wherein the protection layer has a hardness greater than 20 GPa.

4. The driving substrate of claim 1, wherein the first wire comprises a seed pattern and a growth line at a side of the seed pattern far away from the flexible substrate, and
    the seed pattern and the connection wire are in a same layer.

5. The method of claim 1, wherein the second conductive layer comprises a first connection terminal, and
    the planarization layer has a second opening communicating to the first connection terminal in a region where the first connection terminal is located.

6. The driving substrate of claim 1, further comprising:
    a first passivation layer between the flexible insulating layer and the flexible substrate, and having a fourth opening formed at a position corresponding to the first opening.

7. The driving substrate of claim 1, further comprising:
a second passivation layer between the flexible insulating layer and the second conductive layer, and having a hollow structure in the bendable region.

8. The driving substrate of claim 7, wherein the flexible substrate further comprises a bonding region at a side of the bendable region far away from the display region, and
the second passivation layer has vents in the bonding region.

9. The driving substrate of claim 1, further comprising:
a third passivation layer between the second conductive layer and the planarization layer, and having a hollow structure in the bendable region.

10. A display device, comprising a light emitting element and the driving substrate according to claim 1, wherein the light emitting element is at a side of the planarization layer far away from the flexible substrate, and
the light emitting element has a first electrode and a second electrode coupled to a conductive structure in the second conductive layer by a via in the planarization layer.

* * * * *